(12) United States Patent
Mikulic et al.

(10) Patent No.: US 12,184,288 B2
(45) Date of Patent: Dec. 31, 2024

(54) OSCILLATOR CIRCUIT

(71) Applicant: ams International AG, Jona (CH)

(72) Inventors: Josip Mikulic, Graz (AT); Gregor Schatzberger, Graz (AT)

(73) Assignee: AMS INTERNATIONAL AG, Jona (CH)

( * ) Notice: Subject to any disclaimer, the term of this patent is extended or adjusted under 35 U.S.C. 154(b) by 16 days.

(21) Appl. No.: 18/043,096

(22) PCT Filed: Aug. 25, 2021

(86) PCT No.: PCT/EP2021/073550
§ 371 (c)(1),
(2) Date: Feb. 27, 2023

(87) PCT Pub. No.: WO2022/043406
PCT Pub. Date: Mar. 3, 2022

(65) Prior Publication Data
US 2024/0030903 A1    Jan. 25, 2024

(30) Foreign Application Priority Data

Aug. 28, 2020 (GB) .................................... 2013518

(51) Int. Cl.
*H03K 3/0231* (2006.01)
*H03B 5/24* (2006.01)
(Continued)

(52) U.S. Cl.
CPC ............. *H03K 4/94* (2013.01); *H03K 3/0231* (2013.01); *H03K 5/24* (2013.01); *H03K 19/20* (2013.01)

(58) Field of Classification Search
CPC .......... H03B 5/20; H03B 5/24; H03K 3/0231; H03K 4/50; H03K 4/501; H03K 4/502; H03K 5/24; H03K 19/20
(Continued)

(56) References Cited

U.S. PATENT DOCUMENTS

2007/0103243 A1* 5/2007 Gong ................... H03K 3/0231
331/111
2012/0182080 A1 7/2012 Sinitsky et al.
(Continued)

FOREIGN PATENT DOCUMENTS

EP         3393040 A1    10/2018
WO      2015001388 A1     1/2015

OTHER PUBLICATIONS

International Preliminary Report on Patentability dated Feb. 28, 2023, PCT Application No. PCT/EP2021/073550, 11 pages.
(Continued)

*Primary Examiner* — Levi Gannon
(74) *Attorney, Agent, or Firm* — MH2 Technology Law Group LLP

(57) ABSTRACT

An oscillator circuit includes a first integrator unit to charge a first capacitor at a first integration node, a second integrator unit to charge a second capacitor at a second integration node, a chopped comparator unit and a logic unit. The chopped comparator unit includes a switching unit, a sensing comparator and a replica comparator. The switching unit is configured to couple the first integration node, the second integration node and a reference voltage VREF to the sensing comparator and the replica comparator, depending upon a phase determined by a first input clock signal C1 and a second input clock signal C2, which have opposite phases. The logic unit is configured to generate signals C1, C2, D1, D2, E1, E2 for controlling each integrator unit.

6 Claims, 6 Drawing Sheets

(51) Int. Cl.
*H03K 4/94* (2006.01)
*H03K 5/24* (2006.01)
*H03K 19/20* (2006.01)

(58) Field of Classification Search
USPC .................................................. 331/111, 143
See application file for complete search history.

(56) References Cited

U.S. PATENT DOCUMENTS

| 2013/0049875 A1* | 2/2013 | Shiga | H03K 3/011 |
| | | | 331/144 |
| 2014/0062610 A1* | 3/2014 | Ito | H03K 3/0231 |
| | | | 331/186 |
| 2016/0132070 A1* | 5/2016 | Bode | H03K 3/023 |
| | | | 327/294 |

OTHER PUBLICATIONS

International Search Report and Written Opinion dated Dec. 10, 2021, PCT Application No. PCT/EP2021/073550, 14 pages.
Mikulic, J. et al., "A 1-MHz Relaxation Oscillator Core Employing a Self-Compensating Chopped Comparator Pair", IEEE Transactions on Circuits and Systems I: Regular Papers, IEEE, US, May 1, 2019, vol. 66, No. 5, pp. 1728-1736, XP011720026,ISSN: 1549-8328, DOI: 10.1109/TCSI.2019.2895288.

* cited by examiner

FIG. 1 - PRIOR ART

OSCILLATOR CIRCUIT

CROSS-REFERENCE TO RELATED APPLICATIONS

This patent application is a national stage entry from International Application No. PCT/EP2021/073550, filed on Aug. 25, 2021, published as International Publication No. WO 2022/043406 A1 on Mar. 3, 2022, and claims priority to Great Britain patent application 2013518.2, filed Aug. 28, 2020, the disclosures of all of which are incorporated by reference herein in their entireties.

TECHNICAL FIELD OF THE DISCLOSURE

The disclosure relates to an oscillator circuit, particularly but not exclusively, to a relaxation oscillator circuit using a chopped comparator.

BACKGROUND OF THE DISCLOSURE

Relaxation oscillators are the standard replacement for the quartz-based oscillators in fully integrated industrial applications. The reference clock is one of the most important building blocks in such systems, having a direct impact on the overall performance.

Relaxation oscillators offer a good compromise of fast start-up, low power consumption, compact area, and other parameters critical for modern consumer applications. Nevertheless, the stability of the output frequency of such oscillators is limited to a few percentage points by the stability of the reference elements (resistor and capacitor) and non-idealities of the comparator. While the reference elements are technology-dependent and are not improvable by circuit techniques, the performance can be significantly improved by cancelling the offset voltage and the propagation delay of the comparator stage.

FIG. 1 shows a known oscillator circuit. The oscillator circuit comprises a first integrator unit 100, a second integrator unit 200, a chopped comparator unit 300 and a logic unit 400. Each integrator unit 100, 200 is connected to the chopped comparator unit 300 at a respective integration node 121, 221. The integrator units 100, 200 each perform integration in turn; that is, the first integrator unit 100 performs integration while the second integrator unit 200 is idle, and vice versa.

The chopped comparator unit 300 senses the moment when the voltage of the respective integration node 121, 221 reaches a reference voltage VREF and, in response to the sensing, changes a state of the logic unit 400. As a result of the changed state of the logic unit 400, the active integrator unit becomes the idle integrator unit and the previously idle integrator unit becomes the active integrator unit. For example, where the first integrator unit 100 was previously active and the second integrator unit 200 was previously idle, as a result of the changed state of the logic unit 400, the first integrator unit 100 becomes idle and the second integrator unit 200 becomes active.

The circuit illustrated in FIG. 1 is described in more detail in European patent publication no. EP3393040A1.

SUMMARY

The known oscillator circuit has a complex chopped comparator scheme and a complex logic unit. As a result, there is the possibility of lock up which can lead to catastrophic failure.

It is desirable to provide a simplified oscillator circuit which eliminates one or more problems associated with the prior art.

According to a first aspect of the present disclosure, there is provided an oscillator circuit, comprising: a first integrator unit configured to charge a first capacitor at a first integration node; a second integrator unit configured to charge a second capacitor at a second integration node; a chopped comparator unit comprising a switching unit, a sensing comparator to provide a sensing comparator output and a replica comparator to provide a replica comparator output, wherein the chopped comparator unit is coupled to the first integration node, the second integration node, and a reference voltage, wherein the switching unit is configured to couple the first integration node, the second integration node and the reference voltage to the sensing comparator and the replica comparator, depending upon a phase determined by a first input clock signal and a second input clock signal; and a logic unit comprising combinatorial logic, wherein the logic unit receives as inputs; the sensing comparator output and the replica comparator output and the logic unit is configured to generate signals for controlling each integrator unit, and wherein the logic unit is configured to generate the first input clock signal having a first phase and the second input clock signal having a second phase opposite to the first phase.

The first input clock signal alternates between a low and a high state. At the same time, the second input clock signal alternates between a high and a low state. That is, while the first input clock signal is in a low state, the second input clock signal is in a high state, and vice versa. In this way, it can be ensured that the switching unit exists in only two possible states, either with first input clock signal low and second input clock signal high, or with first input clock signal high and second input clock signal low. As a result, it is possible to achieve better signal integrity as the possibility of lock up can be reduced or eliminated.

The first integrator unit performs integration of a first reference current during a first half-cycle of the input clock signals and the second integrator unit performs integration of a second reference current during a second half-cycle of the input clock signals. A first voltage across the first capacitor represents the integration of the first reference current and a second voltage across the second capacitor represents the integration of the second reference current. The reference current can be dimensioned in accordance with the operating regions of the sensing comparator and the replica comparator.

The first voltage is supplied to the sensing comparator and the second voltage is supplied to the replica comparator. The sensing comparator and the replica comparator may have the same structure and electrical properties. The sensing comparator compares the first voltage to a reference voltage during a first half-cycle and the replica comparator compares the second voltage to the reference voltage during a second half-cycle.

In contrast to known systems, the sensing comparator and the replica comparator according to the present disclosure retain their roles throughout the operation of the relaxation oscillator. That is, the sensing comparator always compares a voltage provided at the first integration node with the reference voltage, and the replica comparator always "replicates" the operation of the sensing comparator at a time shift of one half-cycle, thereby providing propagation delay information. By providing a dedicated sensing comparator and a dedicated replica comparator, the circuitry of the relaxation oscillator can be simplified compared to known systems.

In some implementations, the sensing comparator output and the replica comparator output may be directly electrically connected to the logic unit. As a result, the circuitry may be further simplified compared to known relaxation oscillators since there are no intermediate components, for example switching units, electrically connected between the comparators and the logic unit. By dispensing with additional components connected between the comparators and the combinatorial logic of the logic unit, manufacture of the circuit may be further simplified and space required for the circuitry may be minimized.

In some implementations, in a first state in which the first input clock signal is low and the second input clock signal is high, the switching unit may operate such that a first voltage is received at a non-inverting input of the sensing comparator, the reference voltage is received at an inverting input of the sensing comparator, a second voltage is received at a non-inverting input of the replica comparator and the reference voltage is received at an inverting input of the replica comparator.

In some implementations, in a second state in which the first input clock signal is high and the second input clock signal is low, the switching unit may operate such that the reference voltage is received at the non-inverting input of the sensing comparator, the first voltage is received at the inverting input of the sensing comparator, the reference voltage is received at the non-inverting input of the replica comparator and the second voltage is received at the inverting input of the replica comparator.

In some implementations, the switching unit may comprise a first input configured to receive a signal from the first integration node, a second input configured to receive the reference voltage and a third input configured to receive a signal from the second integration node; a first control input configured to receive the first input clock signal and a second control input configured to receive the second input clock signal; and a first output connected to the non-inverting input of the sensing comparator, a second output connected to the inverting input of the sensing comparator, a third output connected to the non-inverting input of the replica comparator and a fourth output connected to the inverting input of the replica comparator.

The switching unit may further comprise a first switch connected between the first input and the fourth output, a second switch connected between the first input and the first output, a third switch connected between the second input and the first output, a fourth switch connected between the second input and the second output, a fifth switch connected between the second input and the third output, a sixth switch connected between the second input and the fourth output, a seventh switch connected between the third input and the second output and an eight switch connected between the third input and the third output; wherein the first, third, fifth and seventh switches may be actuated in response to the first input clock signal and the second, fourth, sixth and eighth switches may be actuated in response to the second input clock signal.

In some implementations, the combinatorial logic of the logic unit may be arranged to generate: the first input clock signal, the second input clock signal, a first measurement signal, a second measurement signal, a first integration disable signal, and a second integration disable signal.

The first and second measurement signals may indicate a propagation delay caused by the chopped comparator unit and/or the logic unit. The first integration disable signal may be configured to ensure that the first integrator unit remains in the idle state while the first integration disable signal is active (e.g. high). The second integration disable signal may be configured to ensure that the second integrator unit remains in the idle state while the second integration disable signal is active (e.g. high). Conversely, when the first integration disable signal is inactive (e.g. low), the first integrator unit is active and, when the second integration disable signal is inactive (e.g. low), the second integrator unit is active.

A logical value of the first input clock signal may be equal to a logical value of the sensing comparator output. A logical value of the second input clock signal may be equal to the inverse of the logical value of the sensing comparator output. A logical value of the first measurement signal may be equal to a logical AND of the logical value of the sensing comparator output and the inverse of a logical value of the replica comparator output. A logical value of the second measurement signal may be equal to a logical AND of the inverse of the logical value of the sensing comparator output and the logical value of the replica comparator output. A logical value of the first integration disable signal may be equal to a logical AND of the logical value of the sensing comparator output and the logical value of the replica comparator output. A logical value of the second integration disable signal may be equal to a logical AND of the inverse of the logical value of the sensing comparator output and the inverse of the logical value of the replica comparator output.

In some implementations, the combinatorial logic of the logic unit may comprise a first NOT gate, a second NOT gate and a third NOT gate, and a first AND gate, a second AND gate, a third AND gate and a fourth AND gate. The first NOT gate may receive as an input the sensing comparator output. The second NOT gate may receive as an input the replica comparator output. The third NOT gate may receive as an input the output of the first NOT gate. The first AND gate may receive as inputs the sensing comparator output and the output of the second NOT gate. The second AND gate may receive as inputs the output of the first NOT gate and the replica comparator output. The third AND gate may receive as inputs the sensing comparator output and the replica comparator output. The fourth AND gate may receive as input the output of the first NOT gate and the output of the second NOT gate.

These and other aspects will be apparent from the embodiments described in the following. The scope of the present disclosure is not intended to be limited by this summary nor to implementations that necessarily solve any or all of the disadvantages noted.

BRIEF DESCRIPTION OF THE DRAWINGS

Some embodiments of the disclosure will now be described by way of example only and with reference to the accompanying drawings, in which.

DETAILED DESCRIPTION OF THE PREFERRED EMBODIMENTS

Generally speaking, the disclosure provides a simplified relaxation oscillator circuit. Some examples of the solution are given in the accompanying figures.

Figure 1:
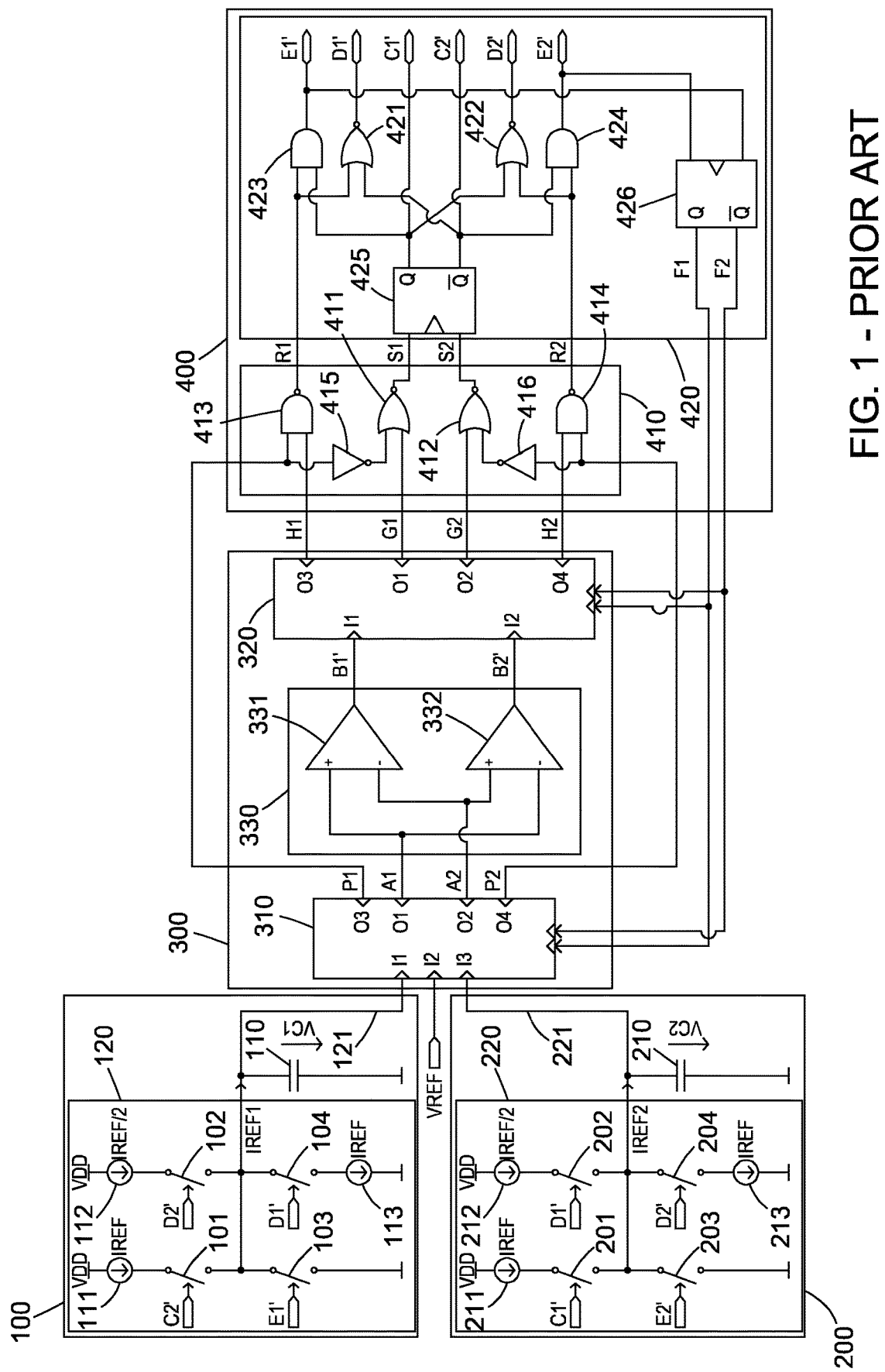
FIG. 1 is a circuit diagram of an oscillator circuit according to the prior art.
Figure 2:
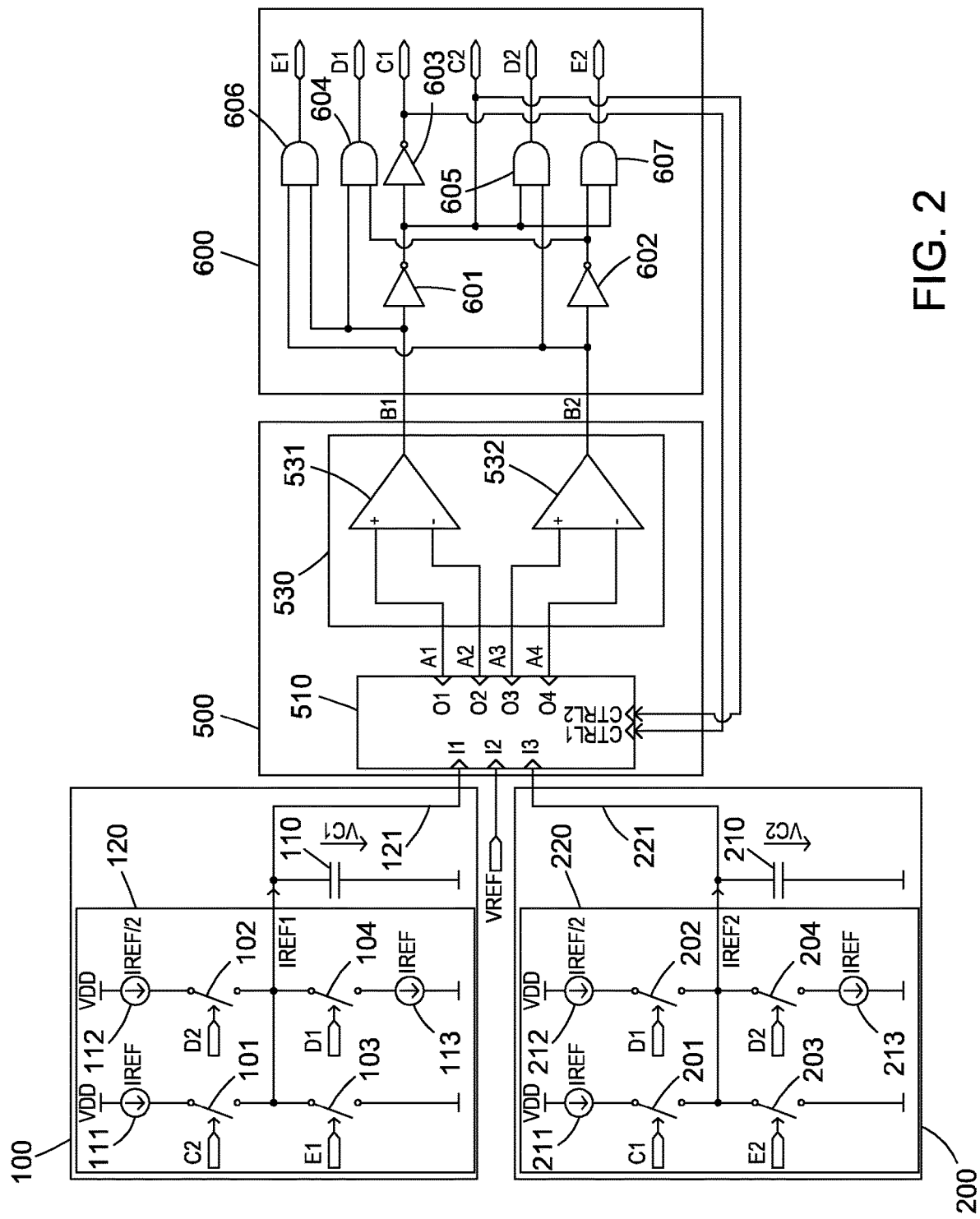
FIG. 2 is a circuit diagram of an oscillator circuit according to the present disclosure.

FIG. 2 shows a circuit diagram of the proposed relaxation oscillator with the propagation delay and offset-voltage compensation using a chopped comparator. In the following text, the architecture of the proposed circuit is described in detail.

The oscillator circuit comprises a first integrator unit 100, a second integrator unit 200, a chopped comparator unit 500 and a logic unit 600. The output of the oscillator circuit is a clock signal which may be used in downstream applications. The oscillator circuit also produces other control signals which are fed back to control various aspects of the oscillator circuit, as described in more detail below.

It is assumed that the reference voltage (VREF) and the reference current (IREF) are provided within a reference generator unit, and are not shown in the schematic.

The proposed relaxation oscillator provides the oscillation in the following way. The integration is performed during a first half-cycle on one of the integrator units 100 or 200, with the other one being idle in the meantime. The chopped comparator unit 500 senses the integration voltage of the active integrator unit and changes the state of the logic unit 600 correspondingly. Change of the logic then initiates a second half-cycle, being complementary to the first one. In addition, the proposed relaxation oscillator comprises the circuitry for the measurement and the cancellation of the propagation delay and offset voltage of the sensing comparator.

The first integrator unit 100 comprises a first charging unit 120 and a first capacitor 110 having the capacitance $C_{REF}$. The first charging unit 120 comprises three current sources 111, 112, and 113 and four switches 101, 102, 103, and 104. The first integrator unit 100 receives a second clock signal C2, a first measurement signal D1, a second measurement signal D2, and a first integration disable signal E1 as inputs. A value of a reference current IREF is used in order to generate the currents 111, 112, and 113. The current source 111 and current source 112 each receive a supply voltage VDD. The current source 113 is connected to a circuit reference potential (e.g. ground).

The inputs to the first integrator unit 100 control the four switches inside the first charging unit 120 in order to generate a first charging current IREF1 to charge the first capacitor 110. In the example illustrated in FIG. 2, the current sources 111 and 113 both have the same value as the reference current, while the current source 112 has half the value of the reference current.

The switch 101 couples the current source 111 to the first integration node 121, and is controlled by the second clock signal C2. The switch 102 couples the current source 112 to the first integration node 121, and is controlled by the second measurement signal D2. The switch 103 couples the circuit reference potential (e.g. ground) to the first integration node 121, and is controlled by the first integration disable signal E1. The switch 104 couples the current source 113 to the first integration node 121, and is controlled by the first measurement signal D1.

The first charging current IREF1 flows into the first capacitor 110, which is connected between the first integration node 121 and the circuit reference potential. A voltage VC1 across the first capacitor 110 represents an integrated form of the first charging current IREF1. Voltage VC1 is also the output of the first integrator unit 100.

The function of the first integrator unit 100 is to perform the integration during the active state of the second clock signal C2. The rate of the integration adapts during the active state of the second measurement signal D2 in such a way that the propagation delay and voltage-offset caused by the sensing comparator 531 can be cancelled. During the active state of the first measurement signal D1, the rate of the integration further adapts to enable the measurement of the experienced propagation delay and voltage offset.

The first integrator unit 100 remains idle during the active state of the first integration disable signal E1.

The second integrator unit 200 comprises a second charging unit 220 and a second capacitor 210 having the capacitance $C_{REF}$. The second charging unit 220 comprises three current sources 211, 212, and 213 and four switches 201, 202, 203, and 204. The second integrator unit 200 receives a first clock signal C1, the first measurement signal D1, the second measurement signal D2, and the second integration disable signal E2 as inputs. The current source 211 and current source 212 each receive the supply voltage VDD. The current source 213 is connected to the circuit reference potential.

The value of the reference current IREF is used in order to generate the currents 211, 212, and 213. The inputs to the second integrator unit 200 control the four switches inside the second charging unit 220 in order to generate a second charging current IREF2. In the example illustrated in FIG. 2, the current sources 211 and 213 both have the same value as the reference current, while the current source 212 has half the value of the reference current.

The switch 201 couples the current source 211 to the second integration node 221, and is controlled by the first clock signal C1. The switch 202 couples the current source 212 to the second integration node 221, and is controlled by the first measurement signal D1. The switch 203 couples the circuit reference potential to the second integration node 221, and is controlled by the second integration disable signal E2. The switch 204 couples the current source 213 to the second integration node 221, and is controlled by the second measurement signal D2. The second charging current IREF2 flows into the second capacitor 210, which is connected between the second integration node 221 and the circuit reference potential. A voltage VC2 across the second capacitor 210 represents an integrated form of the second charging current IREF2. Voltage VC2 is also the output of the second integrator unit 200.

The function of the second integrator unit 200 is to perform the integration during the active state of the first clock signal C1. The rate of the integration adapts during the active state of the first measurement signal D1 in such a way that the propagation delay and voltage-offset caused by the sensing comparator 531 can be cancelled. During the active state of the second measurement signal D2, the rate of the integration further adapts to enable the measurement of the experienced propagation delay and voltage offset. The second integrator unit 200 remains idle during the active state of the second integration disable signal E2.

The chopped comparator unit 500 comprises a switching unit 310 and a comparator unit 530. The switching unit 510 comprises three inputs I1, I2, I3 and four outputs O1, O2, O3, O4. The first input I1 is configured to receive a signal VC1 from the first integration node 121, the second input I2 is configured to receive the reference voltage VREF and the third input I3 is configured to receive a signal VC2 from the second integration node 122. The first output O1 is connected to the non-inverting input (+) of the sensing comparator 531 and configured to provide a signal A1. The second output O2 is connected to the inverting input (−) of the sensing comparator 531 and configured to provide a signal A2. The third output O3 is connected to the non-inverting input of the replica comparator 532 and configured to provide a signal A3. The fourth output O4 is connected to the inverting input of the replica comparator 532 and configured to provide a signal A4.

The switching unit 510 also receives the first input clock signal C1 at a first control input CTRL1 and the second input clock signal C2 at a second control input CTRL2. The operation of the switching unit 510 will be described in more detail below with reference to FIG. 3.

The comparator unit 530 comprises a sensing comparator 531 and a replica comparator 532. The two comparators are designed to have the same structure and electrical properties. The chopped comparator unit 500 takes the first voltage VC1 at the first integration node 121, the second voltage VC2 at the second integration node 221, and the reference voltage VREF as inputs and provides two output signals, namely the sensing comparator output B1 and the replica comparator output B2.

The sensing comparator 531 always compares the first voltage VC1 provided at the first integration node 121 with the reference voltage VREF, and the replica comparator 532 always "replicates" the operation of the sensing comparator 531 at a time shift of one half-cycle, thereby providing propagation delay information. By providing a dedicated sensing comparator 531 and a dedicated replica comparator 532, the circuitry of the relaxation oscillator can be simplified compared to known systems.

The sensing comparator output B1 and the replica comparator output B2 are directly electrically connected to the logic unit 600. In this way, the circuit can be simplified compare to known relaxation oscillator circuits since there are no additional components connected between the comparator unit 530 and the logic unit 600.

The combinatorial logic of the logic unit 600 is arranged to generate: the first input clock signal C1, the second input clock signal C2, the first measurement signal D1, the second measurement signal D2, the first integration disable signal E1, and the second integration disable signal E2.

The combinatorial logic of the logic unit 600 illustrated in FIG. 2 comprises a first NOT gate 601, a second NOT gate 602 and a third NOT gate 603, and a first AND gate 604, a second AND gate 605, a third AND gate 606 and a fourth AND gate 607.

The first NOT gate 601 receives as an input the sensing comparator output B1. The second NOT gate 602 receives as an input the replica comparator output B2. The third NOT gate 603 receives as an input the output of the first NOT gate 601. The first AND gate 604 receives as inputs the sensing comparator output B1 and the output of the second NOT gate 602. The second AND gate 605 receives as inputs the output of the first NOT gate 601 and the replica comparator output B2. The third AND gate 606 receives as inputs the sensing comparator output B1 and the replica comparator output B2. The fourth AND gate 607 receives as input the output of the first NOT gate 601 and the output of the second NOT gate 602.

The first input clock signal C1 is produced at the output of the third NOT gate 603. The second input clock signal C2 is produced at the output of the first NOT gate 601. The first measurement disable signal D1 is produced at the output of the first AND gate 604. The second measurement disable signal D2 is produced at the output of the second AND gate 605. The first integration disable signal E1 is produced at the output of the third AND gate 606. The second integration disable signal E2 is produced at the output of the fourth AND gate 607.

As such, a logical value of the first input clock signal C1 is equal to a logical value of the sensing comparator output B1. A logical value of the second input clock signal C2 is equal to the inverse of the logical value of the sensing comparator output B1. A logical value of the first measurement signal D1 is equal to a logical AND of the logical value of the sensing comparator output B1 and the inverse of a logical value of the replica comparator output B2. A logical value of the second measurement signal D2 is equal to a logical AND of the inverse of the logical value of the sensing comparator output B1 and the logical value of the replica comparator output B2. A logical value of the first integration disable signal E1 is equal to a logical AND of the logical value of the sensing comparator output B1 and the logical value of the replica comparator output B2. A logical value of the second integration disable signal E2 is equal to a logical AND of the inverse of the logical value of the sensing comparator output B1 and the inverse of the logical value of the replica comparator output B2.

It will be appreciated that the logic unit 600 illustrated in FIG. 2 is merely one example of a logic unit for use with the oscillator circuit. Other suitable configurations will be apparent to the person skilled in the art. For example, in some implementations, it may be possible to omit the third NOT gate 603 and to instead tap the sensing comparator output B1 (i.e. before the first NOT gate 601) as the first input clock signal C1.

The outputs from the logic unit 600 are propagated to the first integrator unit 100, the second integrator unit 200 and the chopped comparator unit 500.

Figure 3:
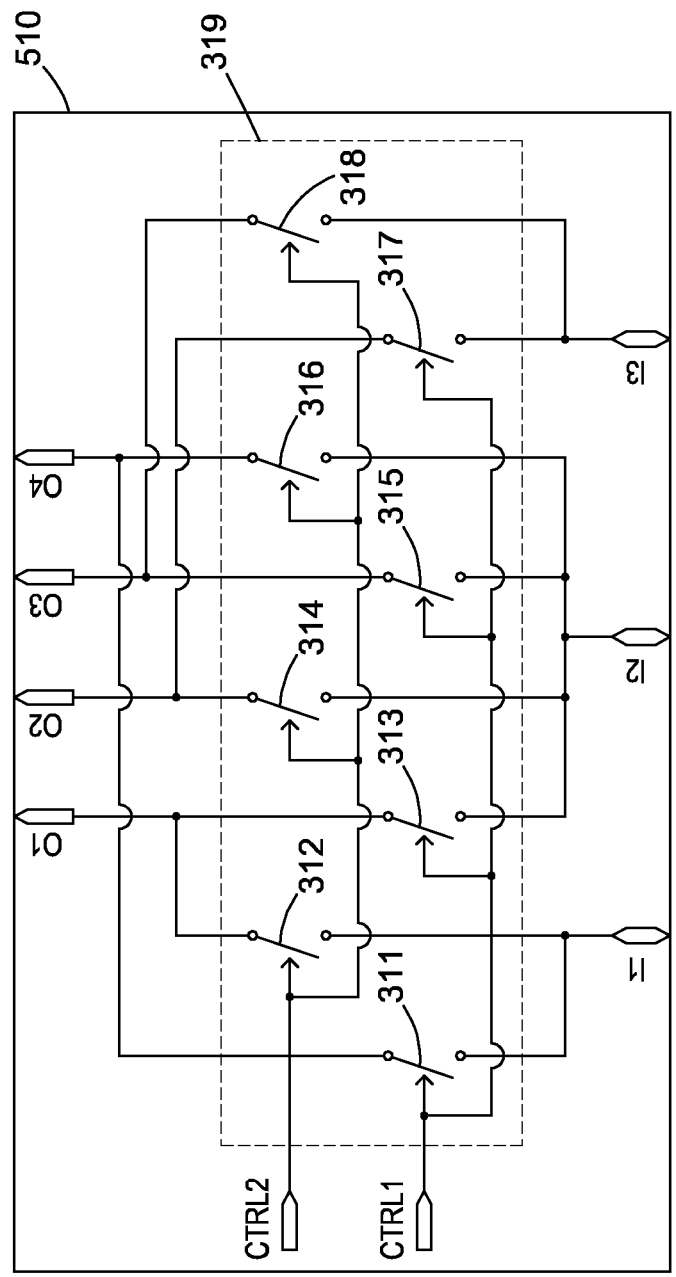
FIG. 3 is a circuit diagram of the switching unit.

The switching unit 510 will now be described in more detail with reference to FIG. 3. The switching unit 510 connects the integrating voltage of the active integrator unit 121 or 221 and the reference voltage VREF to the input terminals of the sensing comparator 531 and the input terminals of the replicating comparator 532 in the corresponding phases determined by the input clock signals C1 and C2 received at the first and second control inputs CTRL1 and CTRL2. The switching unit 510 illustrated in FIG. 3 comprises a switching block 319 having eight switches 311-318 that connect the inputs and outputs of the switching unit 510 and that are operated by the input clock signals C1 and C2 received at the control inputs CTRL1 and CTRL2, respectively.

In particular, the switching unit 510 comprises a first switch 311 connected between the first input I1 and the fourth output O4, a second switch 312 connected between the first input I1 and the first output O1, a third switch 313 connected between the second input I2 and the first output O1, a fourth switch 314 connected between the second input I2 and the second output O2, a fifth switch 315 connected between the second input I2 and the third output O3, a sixth switch 316 connected between the second input I2 and the fourth output O4, a seventh switch 317 connected between the third input I3 and the second output I2 and an eight switch 318 connected between the third input I3 and the third output O3. In the present example, the first 311, third 313, fifth 315 and seventh 317 switches are actuated in response to the first input clock signal C1 and the second 312, fourth 314, sixth 316 and eighth 318 switches are actuated in response to the second input clock signal C2.

As such, in a first state in which the first input clock signal C1 is low and the second input clock signal C2 is high, the non-inverting input of the sensing comparator 531 is connected to the first voltage VC1 (i.e. the signal A1 from the first output O1 is the first voltage VC1), the inverting input of the sensing comparator 531 is connected to the reference voltage VREF (i.e. the signal A2 from the second output O2 is the reference voltage VREF), the non-inverting input of the replica comparator 532 is connected to the second voltage VC2 (i.e. the signal A3 from the third output O3 is the second voltage VC2) and the inverting input of the replica comparator 532 is connected to the reference voltage VREF (i.e. the signal A4 from the fourth output O4 is the reference voltage VREF).

In a second state in which the first input clock signal C1 is high and the second input clock signal C2 is low, the non-inverting input of the sensing comparator 531 is connected to the reference voltage VREF (i.e. the signal A1 from the first output O1 is the reference voltage VREF), the inverting input of the sensing comparator 531 is connected to the second voltage VC2 (i.e. the signal A2 from the second output O2 is the second voltage VC2), the non-inverting input of the replica comparator 532 is connected to the reference voltage VREF (i.e. the signal A3 from the third output O3 is the reference voltage VREF) and the inverting input of the replica comparator 532 is connected to the first voltage VC1 (i.e. the signal A4 from the fourth output is the first voltage VC1).

It will of course be appreciated that the above implementation is described merely as an illustration and that other suitable configurations of the switching unit 510 may also be implemented by the skilled person without deviating from the content of the present disclosure. For example, the switching unit 510 and/or the switching block 319 could alternatively be configured such that the respective outputs in the first state are achieved when the first input clock signal C1 is high and the second input clock signal C2 is low, and such that the respective outputs in the second state are achieved when the first input clock signal C1 is low and the second input clock signal C2 is high.

Figure 4:
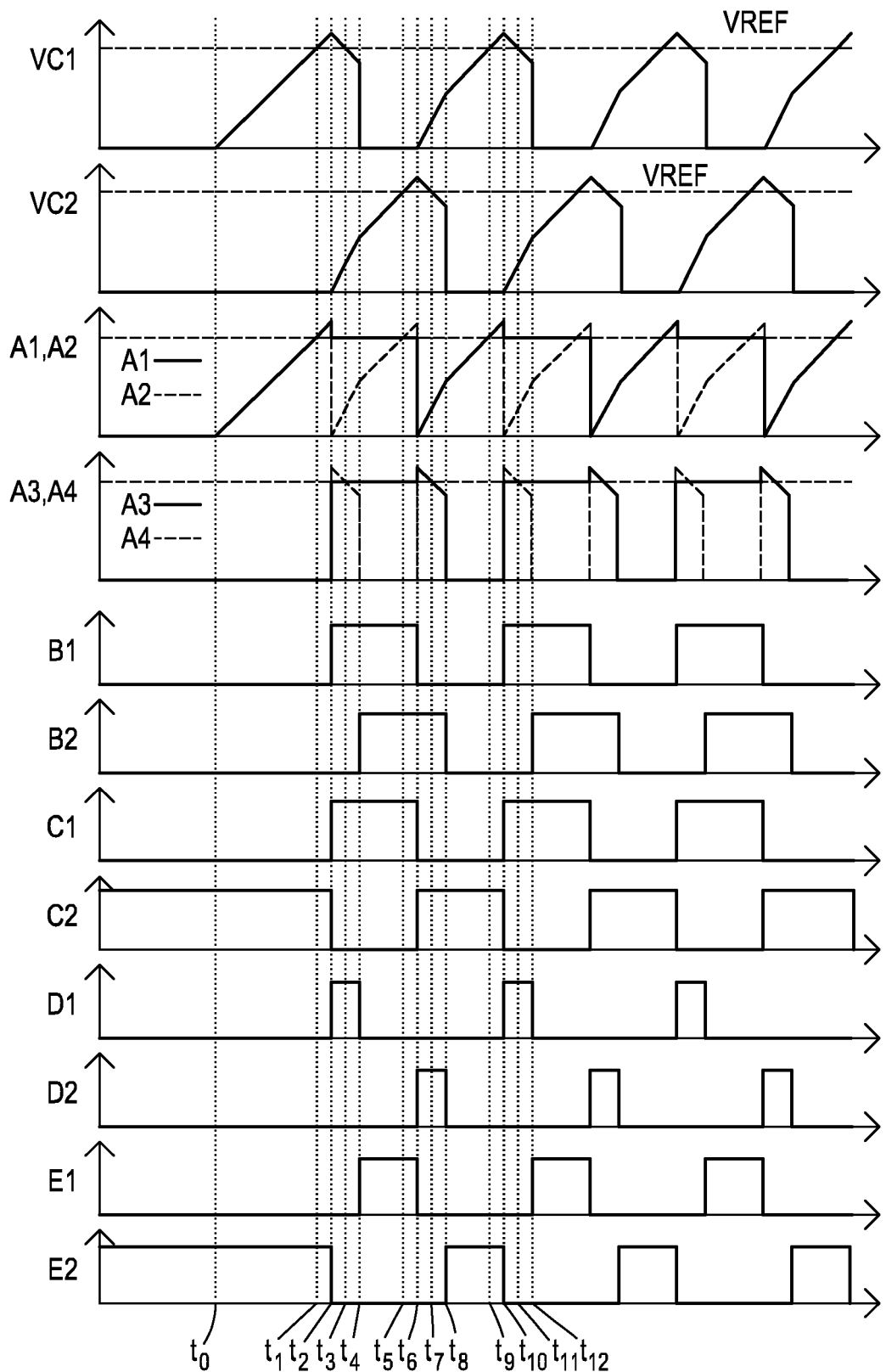
FIG. 4 is a diagram of voltages as functions of time for the oscillator circuit according to FIG. 2.

FIG. 4 is a diagram of voltages as a function of time representing various signals occurring during the operation of the oscillator circuit. It will be appreciated that the various signals are represented only schematically and that the relative heights of the signals do not necessarily indicate the relative values of the signals compared to one another.

At the starting instant to, second input clock signal C2 is presumed to be high/active and the first input clock signal C1 is presumed to be low/inactive. The first capacitor 110 and the second capacitor 210 are presumed to be discharged which means that the first voltage VC1 and the second voltage VC2 are equal to zero. This starting condition may be initiated by a starting circuit (not illustrated).

The sensing comparator 531 sets the value of the sensing comparator output B1 to low/inactive. The replica comparator 532 sets the value of the replica comparator output B2 to low/inactive. Since the first input clock signal C1 is low and the second input clock signal C2 is high, the other signals take values in accordance with the combinatorial logic in the logic unit 600. That is, the signals D1, D2 and E1 are low and the signal E2 is high.

As a result of the circuit function determined by the state of the signals, the chopped comparator unit 500 is in the first state. That is, the signal A1 at the first output O1 is the first voltage VC1, the signal A2 at the second output O2 is the reference voltage VREF, the signal A3 at the third output O3 is the second voltage VC2, and the signal A4 at the fourth output O4 is the reference voltage VREF.

In the first and second integrator units 100, 200, the switches 102, 103, 104, 201, 202, and 204 are open. The switches 101 and 203 are closed. According to the positions of the switches, the current source 111 is active while the current sources 112, 113, 211, 212, 213 are inactive. As a result, the first charging current IREF1 is equal to the circuit reference current IREF while the second charging current IREF2 is equal to zero. The current source 213 is connected to the circuit reference potential (ground) such that the second voltage VC2 is equal to zero.

The first capacitor 110 is charged by the current source 111 having the value IREF. As such, the first voltage VC1 increases linearly with the slew rate (SR) equal to IREF/$C_{REF}$. The second voltage VC2 is zero since it is connected to ground.

At the first instant $t_1$, the first voltage VC1 becomes equal to the reference voltage VREF (signal A2 at this instant). However, because of the non-idealities of the sensing comparator 531, namely the propagation delay ($t_{pd1}$) and the offset voltage ($V_{OFF1}$), the state of the sensing comparator output B1 changes from 0 (low) to 1 (high) at the second instant $t_2$.

As a result of the change of the sensing comparator output B1 at $t=t_2$, the states of the outputs from the logic unit 600 are changed as follows: the first input clock signal C1 changes from 0 to 1, the second input clock signal C2 changes from 1 to 0, the first measurement signal D1 changes from 0 to 1, the second measurement signal D2 remains 0, the first integration disable signal E1 remains 0 and the second integration disable signal E2 changes from 1 to 0.

Owing to the changes to the outputs of the logic unit 600, the chopper state changes from the first state (in which C1=0 and C2=1) to the second state (in which C1=1 and C2=0). In the second state, the signal A1 at the first output O1 of the switching unit 510 is equal to the reference voltage VREF, the signal A2 at the second output O2 is equal to the second voltage VC2, the signal A3 at the third output O3 is equal to the reference voltage VREF and the signal A4 at the fourth output O4 is equal to the first voltage VC1.

In the first and second integrator units 100, 200, the switches 101, 102, 103, 203 and 204 are open while the switches 104, 201 and 202 are closed. According to the positions of the switches, the current sources 211 and 212 are active while the current sources 112, 113, 211, 212, 213 are inactive. As a result, the second charging current IREF2 is equal to 1.5 times the circuit reference current IREF (since the current source 212 has a value of half of the reference current, IREF/2) while the first charging current IREF1 is equal to zero. The value of the second voltage VC2 therefore increases linearly at the slew rate of 1.5IREF/$C_{REF}$. The first voltage VC1 across the capacitor 110 is discharged with the reference current 113, having the value IREF, such that the signal A4 (VC1) decreases linearly having the slew rate IREF/$C_{REF}$.

At the third instant t 3, the first voltage VC1 becomes equal to the reference voltage VREF. Nevertheless, because of the non-idealities of the replica comparator 532, namely the propagation delay ($t_{pd2}$) and offset voltage ($V_{OFF2}$), the state of the replica comparator output B2 only changes from 0 (low) to 1 (high) at the fourth instant $t_4$. In other words, the only difference between the first instant $t_1$ and the third instant $t_3$ is that the first voltage VC1 now has a negative slope.

As a result of the change of the output B2 at the fourth instant t₄, the state of the outputs of the logic unit 600 is altered in the following manner: the first input clock signal C1 remains 1, the second input clock signal C2 remains 0, the first measurement signal D1 changes from 1 to 0, the second measurement signal D2 remains 0, the first integration disable signal E1 changes from 0 to 1 and the second integration disable signal E2 remains 0.

As a result of the change of the outputs of the logic unit 600, the first and second integrator units 100, 200 change such that switches 101, 102, 104, 202, 203, and 204 are open and switches 103 and 201 are closed. In this way, the second capacitor 210 is charged by the current source 211 with the current value IREF, such that the second voltage VC2 increases linearly with the slew rate IREF/$C_{REF}$. The first voltage VC1 is equal to zero since the switch 104 is closed, thereby connecting the current source 113 to ground.

At the fifth instant $t_5$, the second voltage VC2 becomes equal to the reference voltage VREF. However, because of the aforementioned non-idealities of the sensing comparator 531, the state of the sensing comparator output B1 only changes from 1 (high) to 0 (low) at the sixth instant $t_6$.

When the sensing comparator output B1 changes at the sixth instant $t_6$, the states of the outputs of the logic unit 600 are changed as follows: the first input clock signal C1 changes from 1 to 0, the second input clock signal C2 changes from 0 to 1, the first measurement signal D1 remains 0, the second measurement signal D2 changes from 0 to 1, the first integration disable signal E1 changes from 1 to 0 and the second integration disable signal E2 remains 0.

As a result of the change of the outputs of the logic unit, the state of the chopper changes from the second state (C1=1 and C2=0) to the first state (C1=0 and C2=1). The signal A1 at the first output O1 is again the first voltage VC1, the signal A2 at the second output O2 is the reference voltage VREF, the signal A3 at the third output O3 is the second voltage VC2, and the signal A4 at the fourth output O4 is the reference voltage VREF.

In the first and second integrator units 100, 200, the switches 103, 104, 201, 202, and 203 are open. The switches 101, 102 and 204 are closed. According to the positions of the switches, the current sources 111 and 112 are active while the current sources 113, 211, 212, 213 are inactive. As a result, the first charging current IREF1 is equal to 1.5 times the circuit reference current IREF (since the current source 112 has a value of half of the reference current, IREF/2) while the second charging current IREF2 is equal to zero. The current source 213 is connected to the circuit reference potential (ground).

The first capacitor 110 is charged by the current sources 111 and 112 having the combined value of 1.5IREF. As such, the first voltage VC1 increases linearly with the slew rate (SR) equal to 1.5IREF/$C_{REF}$. The second voltage VC2 across the second capacitor 210 is discharged with the reference current 213, having the value IREF, such that the second voltage VC2 decreases linearly having the slew rate IREF/$C_{REF}$.

The second voltage VC2 becomes equal to the reference voltage VREF at the seventh instant $t_7$. However, the state of the replica comparator output B2 only changes from 1 to 0 at the eighth instant is owing to the propagation delay and offset voltage of the second comparator 532.

As a result, at the eighth instant is when the replica comparator output B2 changes from high to low, the outputs of the logic unit 600 behave as follows: the first input clock signal C1 remains 0, the second input clock signal C2 remains 1, the first measurement signal D1 remains 0, the second measurement signal D2 changes from 1 to 0, the first integration disable signal E1 remains 0 and the second integration disable signal E2 changes from 0 to 1.

In the first and second integrator units 100, 200, the switches 102, 103, 104, 201, 202 and 204 are now open while the switches 101 and 203 are closed. As a result, the first capacitor 110 is charged by the reference current IREF from the current source 111 such that the first voltage increases linearly at the slew rate of IREF/$C_{REF}$. The second voltage VC2 is connected to the reference potential via switch 203 such that the value of the second voltage VC2 becomes zero.

Then, at the ninth instant $t_9$, the first voltage VC1 becomes equal to the reference voltage VREF. However, the state of the sensing comparator output B1 does not change from low to high until the tenth instant $t_{10}$ owing to the non-idealities of the sensing comparator 531. The state of the circuit at the tenth instant $t_{10}$ is identical to the state of the circuit at the second instant $t_2$.

Owing to the periodicity of the circuit, the described period from the second instant $t_2$ to the tenth instant $t_{10}$ now repeats indefinitely. As such, the states of the signals within the circuit at the eleventh $t_{11}$ and twelfth $t_{12}$ instants, respectively, are identical to the states of the signals at the third $t_3$ and fourth $t_4$ instants, respectively.

Figure 5:
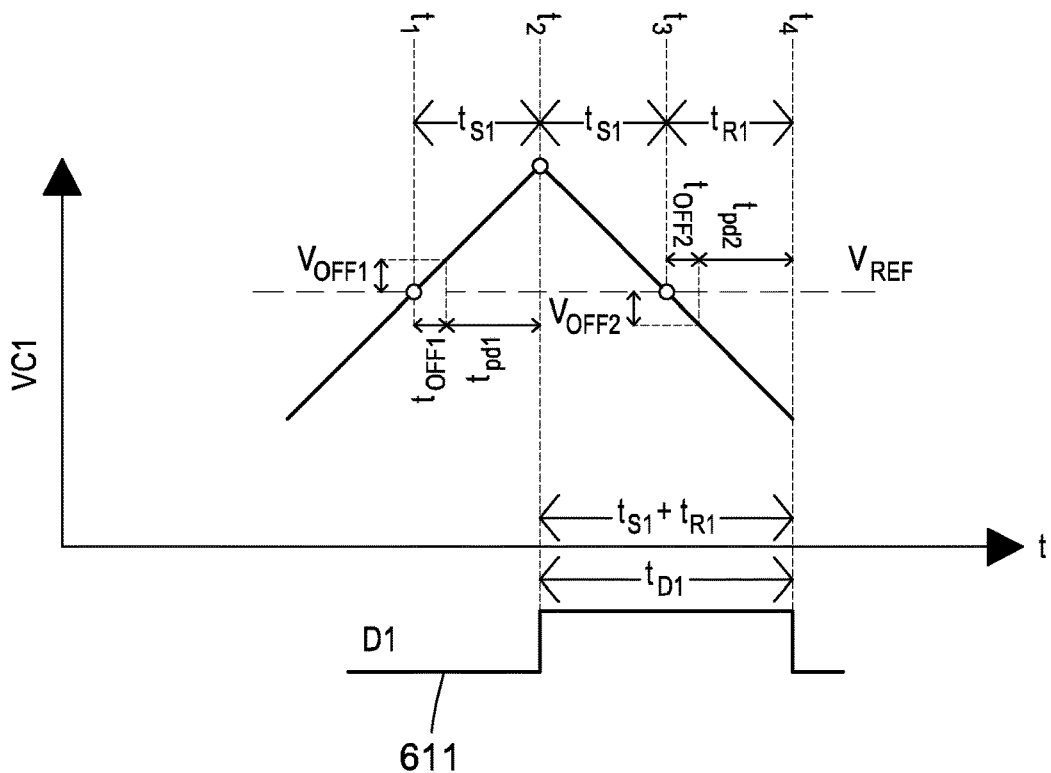
FIG. 5 is a diagram of a first voltage as a function of time.
Figure 6:
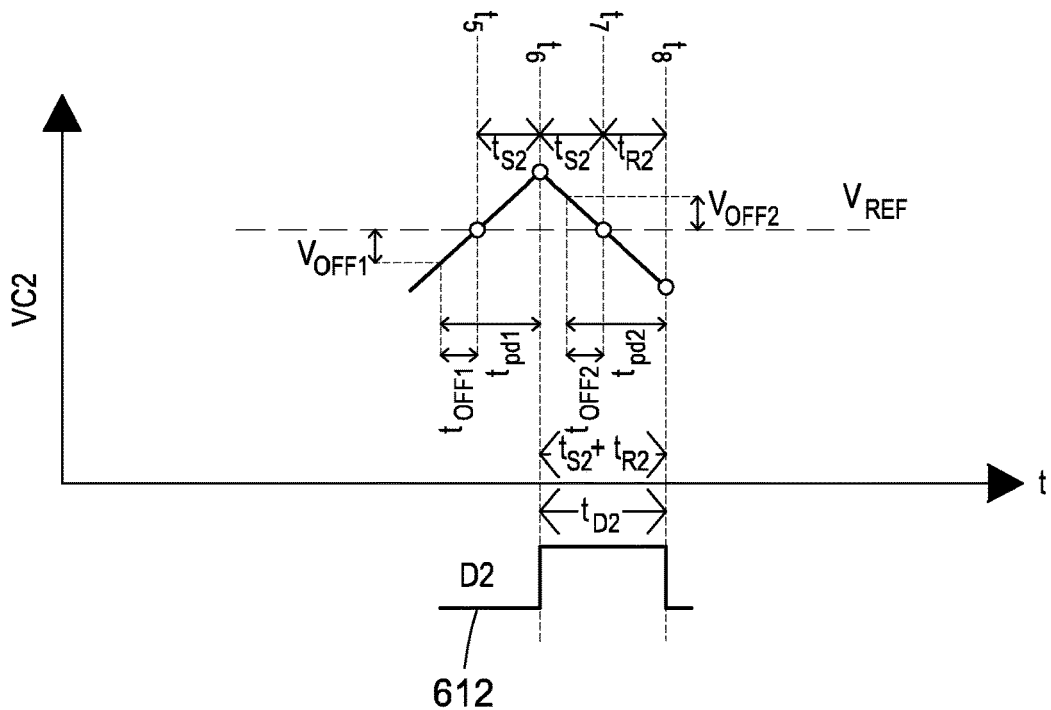
FIG. 6 is a diagram of a second voltage as a function of time.

FIGS. 5 and 6 illustrate the integrating waveforms VC1 and VC2 with respect to the comparator decisions, namely the sensing comparator 531 sense timing at instants $t_1$~$t_2$ and $t_5$~$t_6$, and the replica comparator 532 sense timing at instants $t_3$~$t_4$ and $t_7$~$t_8$.

At the first instant $t_1$, the integrating signal VC1 becomes equal to the reference voltage VREF. Considering that the chopper is in the first state, the inputs of the first comparator are: the first voltage VC1 at the non-inverting input and the reference voltage VREF at the inverting input.

The offset voltage of the sensing comparator $V_{OFF1}$ is superimposed on the reference voltage $V_{REF}$. As a result, the output of the first comparator is changed after the first sense time $t_{S1}$, which is determined by the propagation delay $t_{pd1}$ and the offset voltage $V_{OFFF1}$ of the sensing comparator. The first sense time $t_{S1}$ is given by:

$$t_{S1} = t_2 - t_1 = t_{pd1} + t_{OFF1} \quad \text{(Equation 1)}$$

where $$t_{OFF1} = V_{OFF1} \cdot \frac{C_{REF}}{I_{REF}} \quad \text{(Equation 2)}$$

Based on the equivalent absolute values of the slew rates of the first voltage VC1 prior to and after the second instant $t_2$, the following is valid:

$$t_2 - t_1 = t_3 - t_2 = t_{S1} \quad \text{(Equation 3)}$$

At the third instant $t_3$, the first voltage VC1 again becomes equal to the reference voltage VREF. Since the chopper is in the second state, the inputs to the replica comparator 532 are the reference voltage VREF at the non-inverting input and the first voltage VC1 at the inverting input.

The offset voltage of the replica comparator $V_{OFF2}$ is superimposed on the reference voltage VREF having the opposite sign. As a result, the output of the replica comparator 532 is changed after the first replica time $t_{R1}$, which is determined by propagation delay $t_{pd2}$ and the offset voltage $V_{OFF2}$ of the replica comparator 532. The first replica time $t_{R1}$ is given by:

$$t_{R1} = t_4 - t_3 = t_{pd2} + t_{OFF2} \quad \text{(Equation 4)}$$

where $$t_{OFF2} = V_{OFF2} \cdot \frac{C_{REF}}{I_{REF}} \quad \text{(Equation 5)}$$

Similarly, at the fifth instant $t_5$, the second voltage VC2 becomes equal to the reference voltage VREF. Since the chopper is in the second state, the inputs to the sensing comparator are the second voltage VC2 at the inverting input and the reference voltage VREF at the non-inverting input.

The offset voltage $V_{OFF1}$ of the sensing comparator 531 is superimposed on the reference voltage VREF with opposite sign. As a result, the output of the sensing comparator 531 is changed after the second sense time $t_{S2}$, which is determined by the propagation delay $t_{pd2}$ and the offset voltage $V_{OFF1}$ of the first comparator 532. In particular, the second sense time $t_{S2}$ is given by:

$$t_{S2} = t_6 - t_5 = t_{pd1} - t_{OFF1} \quad \text{(Equation 6)}$$

Based on the equivalent absolute values of the slew rates of the second voltage VC2 prior to and after the sixth instant $t_6$, the following is valid:

$$t_6 - t_5 = t_7 - t_6 = t_{S2} \quad \text{(Equation 7)}$$

At the seventh instant $t_7$, the second voltage VC2 again becomes equal to the reference voltage VREF. At the seventh instant, the chopper is in the first state and so the second voltage VC2 is supplied to the non-inverting input of the replica comparator 532 and the reference voltage VREF is supplied to the inverting input of the replica comparator 532.

The offset voltage $V_{OFF2}$ of the replica comparator 532 is superimposed on the reference voltage VREF. As a result, the output of the replica comparator B2 is changed after the second replica time $t_{R2}$ determined by propagation delay $t_{pd2}$ and the offset voltage $V_{OFF2}$ of the second comparator according to Equation 8:

$$t_{R2} = t_8 - t_7 = t_{pd2} - t_{OFF2} \quad \text{(Equation 8)}$$

Figure 7:
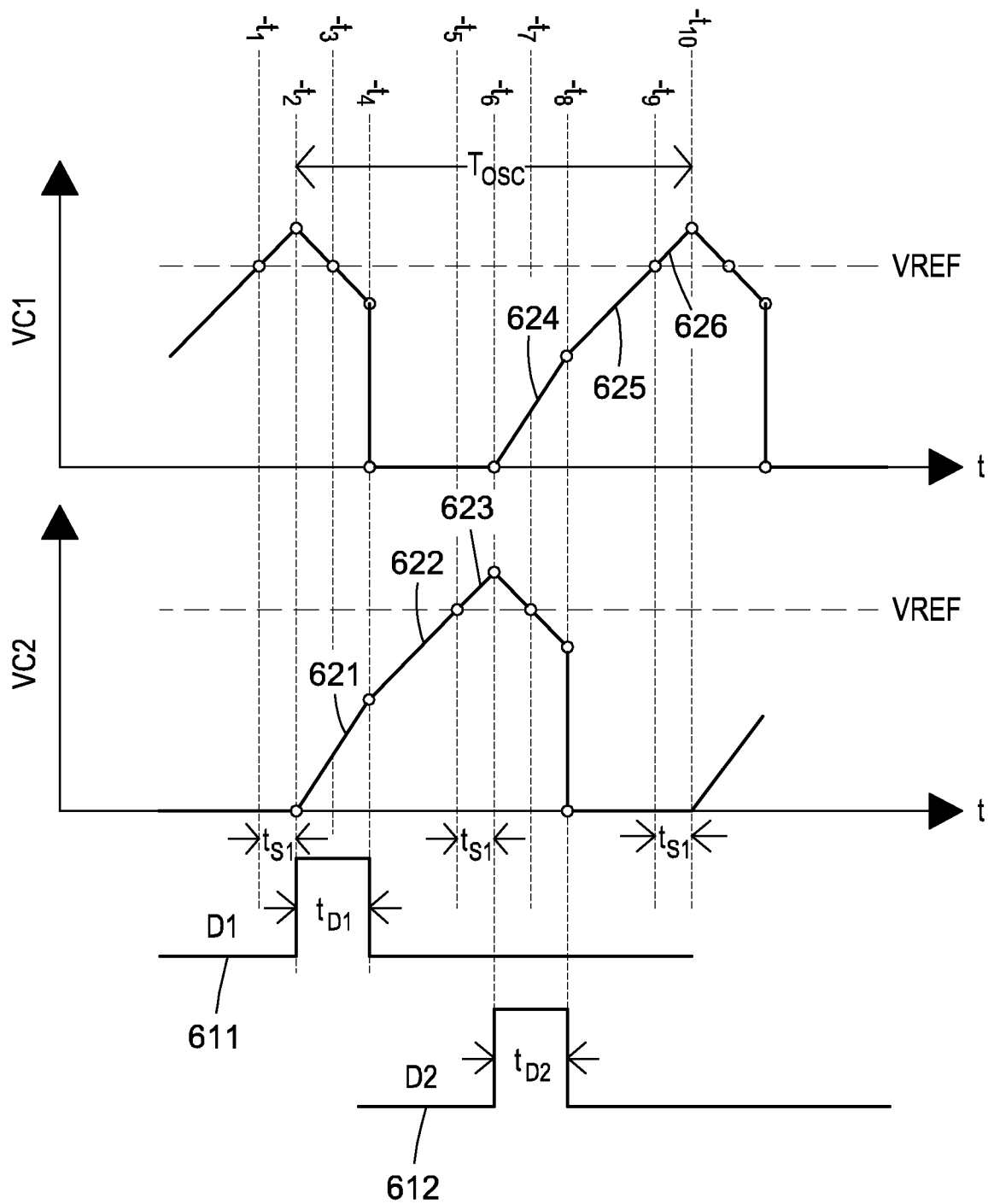
FIG. 7 is a further diagram of the first and second voltages as functions of time.

FIG. 7 shows a further diagram of the first and second voltages VC1 and VC2. With reference to FIG. 7, the expression for the period $T_{OSC}$ of the oscillation can be expressed as the sum of the durations of different time segments 621, 622, 623, 624, 625, 626:

$$T_{OSC} = t_{10} - t_2 = t_{621} + t_{622} + t_{623} + t_{624} + t_{625} + t_{626} \quad \text{(Equation 9)}$$

Where the first time segment 621 is given by:

$$t_{621} = t_{D1} = t_{S1} + t_{R1} \quad \text{(Equation 10)}$$

the second time segment 622 is given by:

(Equation 11)

$$t_{622} = t_5 - t_4 = \frac{V_{REF} - VC2_{@t_4}}{\frac{I_{REF}}{C_{REF}}} =$$

$$\frac{V_{REF} - 1.5 \cdot \frac{I_{REF}}{C_{REF}} \cdot t_{D1}}{\frac{I_{REF}}{C_{REF}}} = \frac{C \cdot V_{REF}}{I_{REF}} - 1.5 \cdot t_{D1}$$

the third time segment 623 is given by:

$$t_{623} = t_{S2} \quad \text{(Equation 12)}$$

the fourth time segment 624 is given by:

$$t_{624} = t_{D2} = t_{S2} + t_{R2} \quad \text{(Equation 13)}$$

the fifth time segment 625 is given by:

(Equation 14)

$$t_{625} = t_9 - t_8 = \frac{V_{REF} - VC1_{@t_8}}{\frac{I_{REF}}{C_{REF}}} =$$

$$\frac{V_{REF} - 1.5 \cdot \frac{I_{REF}}{C_{REF}} \cdot t_{D2}}{\frac{I_{REF}}{C_{REF}}} = \frac{C \cdot V_{REF}}{I_{REF}} - 1.5 \cdot t_{D2}$$

and the sixth time segment 626 is given by:

$$t_{626} = t_{S1} \quad \text{(Equation 15)}.$$

Considering the above equations 9 to 15, the expression for the period can be reduced to:

$$T_{OSC} = t_{D1} + \frac{C \cdot V_{REF}}{I_{REF}} - \quad \text{(Equation 16)}$$

$$1.5 \cdot t_{D1} + t_{S2} + t_{D2} + \frac{C \cdot V_{REF}}{I_{REF}} - 1.5 \cdot t_{D2} + t_{S1}.$$

Equation 16, in turn, may be further reduced to:

$$T_{OSC} = \frac{2 \cdot C \cdot V_{REF}}{I_{REF}} + t_{S1} + t_{S2} - 0.5 \cdot t_{D1} - 0.5 \cdot t_{D2}. \quad \text{(Equation 17)}$$

In other words, the period $T_{OSC}$ of the oscillation is determined by the reference values ($C_{REF}$, $V_{REF}$, $I_{REF}$) and the sensing time ($t_{S1} + t_{S2}$) which is additionally compensated by 50% of the duration of the first and second measurement signals D1 and D2 ($-0.5 t_{D1} - 0.5 t_{D2}$).

If the specific expressions for the first and second sense times $t_{S1}$, $t_{S2}$ and the first and second measurement pulse times $t_{D1}$, and $t_{D2}$ are taken into account, the expression for the oscillation period $T_{OSC}$ reduces to:

$$T_{OSC} = \frac{2 \cdot C \cdot V_{REF}}{I_{REF}} + (t_{pd1} + t_{OFF1}) + \quad \text{(Equation 18)}$$

$$(t_{pd1} - t_{OFF1}) - 0.5 \cdot (t_{pd1} + t_{OFF1} + t_{pd2} + t_{OFF2}) -$$

$$0.5 \cdot (t_{pd1} - t_{OFF1} + t_{pd2} - t_{OFF2}).$$

Equation 18 may, in turn, be further reduced to:

$$T_{OSC} = \frac{2 \cdot C \cdot V_{REF}}{I_{REF}} + t_{pd1} - t_{pd2} \quad \text{(Equation 19)}$$

It can be seen from Equations 18 and 19 that the influence of the comparator offset is completely cancelled, while the cancellation of the propagation delay is determined by the matching properties of the two comparators. Considering that $t_{pd1} \approx t_{pd2}$ in case of the properly matched structures of the two comparators, the expression for the oscillation period can be approximated with:

$$T_{OSC} \approx \frac{2 \cdot C \cdot V_{REF}}{I_{REF}}. \quad \text{(Equation 20)}$$

Embodiments of the present disclosure can be employed in many different applications including in various small outline integrated circuits (SOIC) and sensors that require a precision oscillator having low temperature and line sensitivity.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in any embodiments, whether alone or in any appropriate combination with any other feature disclosed or illustrated herein.

The invention claimed is:

1. An oscillator circuit, comprising:
a first integrator unit configured to charge a first capacitor at a first integration node;
a second integrator unit configured to charge a second capacitor at a second integration node;
a chopped comparator unit comprising a switching unit, a sensing comparator to provide a sensing comparator output and a replica comparator to provide a replica comparator output, wherein the chopped comparator unit is coupled to the first integration node, the second integration node, and a reference voltage,
wherein the switching unit is configured to couple the first integration node, the second integration node and the reference voltage to the sensing comparator and the replica comparator, depending upon a phase determined by a first input clock signal and a second input clock signal; and
a logic unit comprising combinatorial logic, wherein the logic unit receives as inputs;
the sensing comparator output and the replica comparator output and the logic unit is configured to generate signals for controlling each integrator unit, wherein the logic unit is configured to generate the first input clock signal having a first phase and the second input clock signal having a second phase opposite to the first phase, and
wherein the sensing comparator output and the replica comparator output are directly electrically connected to the logic unit, and
wherein the switching unit comprises:
a first input configured to receive a signal from the first integration node, a second input configured to receive the reference voltage, and a third input configured to receive a signal from the second integration node;
a first control input configured to receive the first input clock signal and a second control input configured to receive the second input clock signal; and
a first output connected to a non-inverting input of the sensing comparator, a second output connected to the inverting input of the sensing comparator, a third output connected to the non-inverting input of the replica comparator and a fourth output connected to the inverting input of the replica comparator.

2. The oscillator circuit of claim 1, wherein, in a first state in which the first input clock signal is low and the second input clock signal is high, the switching unit operates such that a first voltage is received at the non-inverting input of the sensing comparator, the reference voltage is received at an inverting input of the sensing comparator, a second voltage is received at the non-inverting input of the replica comparator and the reference voltage is received at an inverting input of the replica comparator.

3. The oscillator circuit of claim 2, wherein, in a second state in which the first input clock signal is high and the second input clock signal is low, the switching unit operates such that the reference voltage is received at the non-inverting input of the sensing comparator, the second voltage is received at the inverting input of the sensing comparator, the reference voltage is received at the non-inverting input of the replica comparator and the first voltage is received at the inverting input of the replica comparator.

4. The oscillator circuit of claim 1, wherein the switching unit comprises:
a first switch connected between the first input and the fourth output, a second switch connected between the first input and the first output, a third switch connected between the second input and the first output, a fourth switch connected between the second input and the second output, a fifth switch connected between the second input and the third output, a sixth switch connected between the second input and the fourth output, a seventh switch connected between the third input and the second output and an eight switch connected between the third input and the third output; and
wherein the first, third, fifth and seventh switches are actuated in response to the first input clock signal and the second, fourth, sixth and eighth switches are actuated in response to the second input clock signal.

5. An oscillator circuit comprising:
a first integrator unit configured to charge a first capacitor at a first integration node;
a second integrator unit configured to charge a second capacitor at a second integration node;
a chopped comparator unit comprising a switching unit, a sensing comparator to provide a sensing comparator output and a replica comparator to provide a replica comparator output, wherein the chopped comparator unit is coupled to the first integration node, the second integration node, and a reference voltage,
wherein the switching unit is configured to couple the first integration node, the second integration node and the reference voltage to the sensing comparator and the replica comparator, depending upon a phase determined by a first input clock signal and a second input clock signal; and
a logic unit comprising combinatorial logic, wherein the logic unit receives as inputs;
the sensing comparator output and the replica comparator output and the logic unit is configured to generate signals for controlling each integrator unit, wherein the logic unit is configured to generate the first input clock signal having a first phase and the second input clock signal having a second phase opposite to the first phase,
wherein the sensing comparator output and the replica comparator output are directly electrically connected to the logic unit,
wherein the combinatorial logic of the logic unit is arranged to generate: the first input clock signal, the second input clock signal, a first measurement signal, a second measurement signal, a first integration disable signal, and a second integration disable signal, wherein a logical value of the first input clock signal is equal to a logical value of the sensing comparator output, wherein a logical value of the second input clock signal is equal to an inverse of the logical value of the sensing comparator output, wherein a logical value of the first measurement signal is equal to a logical AND of the logical value of the sensing comparator output and an inverse of a logical value of the replica comparator output, wherein a logical value of the second measurement signal is equal to a logical AND of the inverse of the logical value of the sensing comparator output and the logical value of the replica comparator output, wherein a logical value of the first integration disable signal is equal to a logical AND of the logical value of the sensing comparator output and the logical value of the replica comparator output; and wherein a logical value of the second integration disable signal is equal to a logical AND of the inverse of the logical value of the sensing comparator output and the inverse of the logical value of the replica comparator output.

6. An oscillator circuit comprising:

a first integrator unit configured to charge a first capacitor at a first integration node;

a second integrator unit configured to charge a second capacitor at a second integration node;

a chopped comparator unit comprising a switching unit, a sensing comparator to provide a sensing comparator output and a replica comparator to provide a replica comparator output, wherein the chopped comparator unit is coupled to the first integration node, the second integration node, and a reference voltage, wherein the switching unit is configured to couple the first integration node, the second integration node and the reference voltage to the sensing comparator and the replica comparator, depending upon a phase determined by a first input clock signal and a second input clock signal; and a logic unit comprising combinatorial logic, wherein the logic unit receives as inputs;

the sensing comparator output and the replica comparator output and the logic unit is configured to generate signals for controlling each integrator unit, wherein the logic unit is configured to generate the first input clock signal having a first phase and the second input clock signal having a second phase opposite to the first phase, wherein the sensing comparator output and the replica comparator output are directly electrically connected to the logic unit, wherein the combinatorial logic of the logic unit is arranged to generate: the first input clock signal, the second input clock signal, a first measurement signal, a second measurement signal, a first integration disable signal, and a second integration disable signal, and wherein the combinatorial logic of the logic unit comprises:

a first NOT gate, a second NOT gate and a third NOT gate; and a first AND gate, a second AND gate, a third AND gate and a fourth AND gate;

wherein the first NOT gate receives as an input the sensing comparator output, the second NOT gate receives as an input the replica comparator output, and the third NOT gate receives as an input the output of the first NOT gate, and wherein the first AND gate receives as inputs the sensing comparator output and the output of the second NOT gate, the second AND gate receives as inputs the output of the first NOT gate and the replica comparator output, the third AND gate receives as inputs the sensing comparator output and the replica comparator output, and the fourth AND gate receives as inputs the output of the first NOT gate and the output of the second NOT gate.

* * * * *